(12) United States Patent
Cheong et al.

(10) Patent No.: US 12,500,194 B2
(45) Date of Patent: Dec. 16, 2025

(54) SEMICONDUCTOR PACKAGE AND METHOD FOR FABRICATING THE SAME

(71) Applicant: Samsung Electronics Co., Ltd., Suwon-si (KR)

(72) Inventors: Young Hun Cheong, Seoul (KR); Young Lyong Kim, Anyang-si (KR); Cheol Soo Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 447 days.

(21) Appl. No.: 17/717,619

(22) Filed: Apr. 11, 2022

(65) Prior Publication Data

US 2023/0079686 A1    Mar. 16, 2023

(30) Foreign Application Priority Data

Sep. 10, 2021    (KR) .......................... 10-2021-0120783

(51) Int. Cl.
*H01L 23/00*      (2006.01)
*H01L 21/56*      (2006.01)
*H01L 23/31*      (2006.01)

(52) U.S. Cl.
CPC ............ *H01L 24/13* (2013.01); *H01L 21/565* (2013.01); *H01L 21/568* (2013.01); *H01L 23/3185* (2013.01); *H01L 2224/10125* (2013.01); *H01L 2924/3511* (2013.01); *H01L 2924/365* (2013.01)

(58) Field of Classification Search
CPC ............................................ H01L 2225/06562
See application file for complete search history.

(56) References Cited

U.S. PATENT DOCUMENTS

| | | | |
|---|---|---|---|
| 6,376,769 B1 * | 4/2002 | Chung | B32B 33/00 257/E23.07 |
| 6,518,675 B2 | 2/2003 | Kim et al. | |
| 7,262,077 B2 * | 8/2007 | Lai | H01L 23/3121 257/E23.125 |
| 8,866,301 B2 * | 10/2014 | Lin | H01L 25/0657 257/738 |

(Continued)

FOREIGN PATENT DOCUMENTS

| | | |
|---|---|---|
| KR | 2002-0011414 A | 2/2002 |
| KR | 2015-0066184 A | 6/2015 |

(Continued)

OTHER PUBLICATIONS

Office Action issued May 27, 2025 in Korean Application No. 10-2021-0120783.

*Primary Examiner* — Yu-Hsi D Sun
(74) *Attorney, Agent, or Firm* — Harness, Dickey & Pierce, P.L.C.

(57) ABSTRACT

Provided is a semiconductor package with improved reliability. The semiconductor package includes: a plurality of connection terminals on a first surface of the semiconductor device; a protection member on the first surface of the semiconductor device and partially covers side surfaces of the plurality of connection terminals such that the protective member exposes lower surfaces of the plurality of connection terminals; and a mold member that covers a side surface of the semiconductor device and a portion of the protection member such that the mold member does not cover the lower surfaces of the plurality of connection terminals.

11 Claims, 11 Drawing Sheets

(56) References Cited

U.S. PATENT DOCUMENTS

| | | | |
|---|---|---|---|
| 9,343,432 | B2 | 5/2016 | Lee et al. |
| 9,390,993 | B2 | 7/2016 | Zhao et al. |
| 9,508,651 | B2 | 11/2016 | Onodera et al. |
| 9,892,916 | B2 | 2/2018 | Lim et al. |
| 2007/0273019 | A1 | 11/2007 | Huang et al. |
| 2013/0113099 | A1* | 5/2013 | Lim ....................... H01L 24/05 |
| | | | 257/773 |

FOREIGN PATENT DOCUMENTS

| | | |
|---|---|---|
| KR | 10-1749870 B1 | 7/2017 |
| KR | 2020-0006734 A | 1/2020 |

* cited by examiner

SEMICONDUCTOR PACKAGE AND METHOD FOR FABRICATING THE SAME

CROSS-REFERENCE TO RELATED APPLICATION

This application claims priority from Korean Patent Application No. 10-2021-0120783 filed on Sep. 10, 2021 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor package and a method for fabricating the same.

2. Description of the Related Art

A wafer level package may implement a small form factor and may shorten a length of input/output signals from a semiconductor chip to a printed circuit board, and thus is mainly used for a high-speed operation device.

However, the semiconductor chip may be exposed to the outside and/or external forces, and thus, may be subjected to external impact in, e.g., a sorting and test process and may be mechanically damaged.

SUMMARY

Aspects of the present disclosure provide a semiconductor package with improved reliability.

Aspects of the present disclosure also provide a method for fabricating a semiconductor package with improved reliability.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a semiconductor package includes: a semiconductor device; a plurality of connection terminals on a first surface of the semiconductor device; a protection member on the first surface of the semiconductor device and partially covers side surfaces of the plurality of connection terminals such that the protective member exposes lower surfaces of the plurality of connection terminals; and a mold member that covers a side surface of the semiconductor device and a portion of the protection member such that the mold member does not cover the lower surfaces of the plurality of connection terminals.

According to an aspect of the present disclosure, a semiconductor package includes: a semiconductor device; a plurality of connection terminals on a first surface of the semiconductor device; a protection member on the first surface of the semiconductor device and partially covers side surfaces of the plurality of connection terminals such that the protection member exposes lower surfaces of the plurality of connection terminals; and a mold member that covers a side surface of the semiconductor device and a portion of the protection member such that the mold member exposes a second surface of the semiconductor device and does not cover the lower surfaces of the plurality of connection terminals, the second surface opposite to the first surface, wherein the protection member extends to the side surface of the semiconductor device such that a first portion of the side surface of the semiconductor device is in contact with the protection member, and a second portion of the side surface of the semiconductor device is in contact with the mold member, and a difference between a coefficient of thermal expansion of the protection member and a coefficient of thermal expansion of the plurality connection terminals is smaller than a difference between a coefficient of thermal expansion of the mold member and the coefficient of thermal expansion of the plurality of connection terminals.

A method for fabricating a plurality of semiconductor packages from a plurality of intermediate structures, each of the intermediate structures including a semiconductor device, a plurality of connection terminals on a first surface of the semiconductor device, and a protective material layer on the first surface of the semiconductor device and between the plurality of connection terminals, the method comprising: fixing the plurality of intermediate structures onto a support substrate, using an adhesive layer, such that the plurality of connection terminals and the protective material layer of each of the plurality of intermediate structures face the support substrate and the adhesive layer is between the support substrate and the plurality of intermediate structures; forming a mold material layer on the support substrate such that the mold material layer covers the plurality of intermediate structures; removing the support substrate; and forming the plurality of semiconductor packages by dividing the mold material layer into a plurality of units, wherein, for a semiconductor package of the plurality of semiconductor packages, the protective material layer extends to a portion of a side surface of the semiconductor device and the plurality of connection terminals protrude from the protective material layer to come into contact with the adhesive layer by a pressure applied during the forming of the mold material layer.

Detailed contents of other example embodiments are described in a detailed description and are illustrated in the accompanying drawings.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Figure 1:
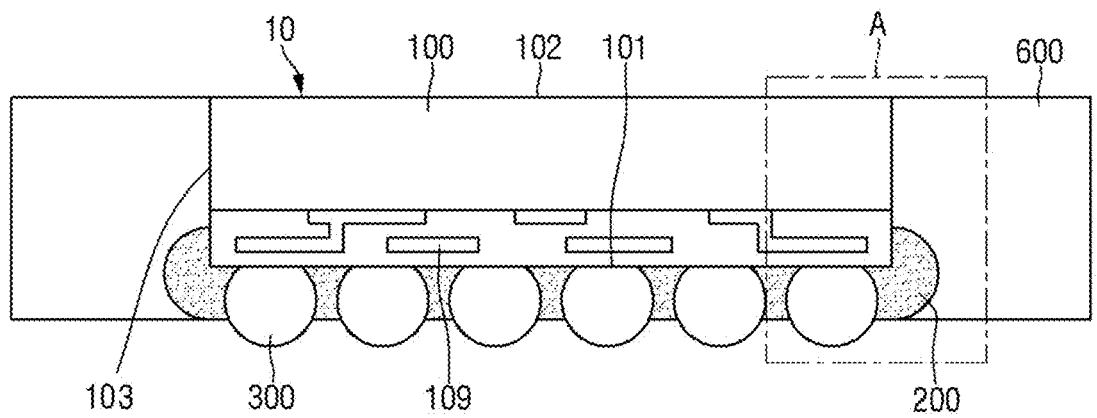
FIG. 1 is a cross-sectional view for describing a semiconductor package according to some example embodiments.

Hereinafter, some example embodiments of the present disclosure will be described in detail with reference to the accompanying drawings. The same components in the drawings will be denoted by the same reference numerals, and an overlapping description therefor will be omitted.

In the description, spatially relative terms such as "lower", "upper," "above," "under," etc. may be used herein for ease of description to describe one element's relationship to another element. Such spatially relative terms are intended to encompass different orientations of the device in use or operation in addition to the orientation depicted in the figures. For example, the device may also be oriented in other ways (for example, turned over, and/or rotated 90 degrees and/or at other orientations), and the spatially relative terms used herein are to be interpreted accordingly.

Figure 2:
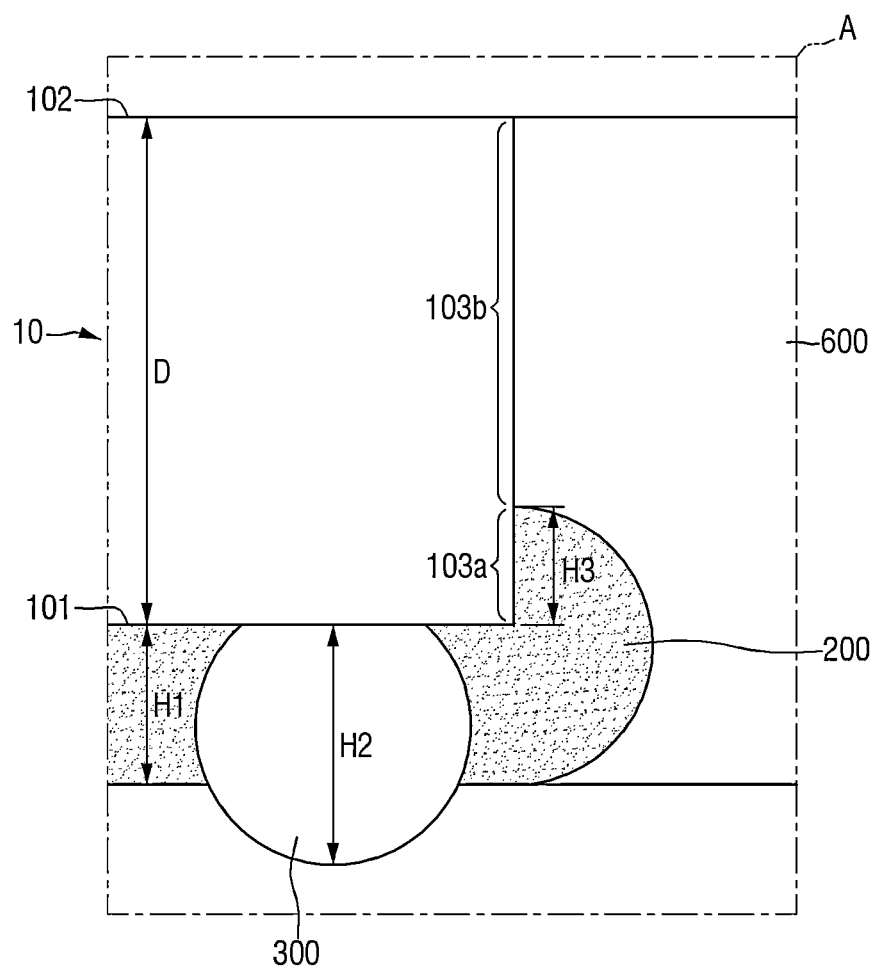
FIG. 2 is an enlarged view of region A of FIG. 1.

FIG. 1 is a cross-sectional view for describing a semiconductor package according to some example embodiments. FIG. 2 is an enlarged view of region A of FIG. 1.

Referring to FIGS. 1 and 2, the semiconductor package includes a semiconductor device 10, a plurality of connection terminals 300, a protection member 200, a mold member 600, and/or the like.

The semiconductor device 10, as is illustrated in FIG. 1, may have a fan-in structure. For example, in the semiconductor device 10, the semiconductor chip 100 and the re-distributed structure 109 have substantially the same area.

The plurality of connection terminals 300 are disposed on one surface 101 (e.g., a lower surface) of the semiconductor device 10. For example, the plurality of connection terminals 300 may be connected to pads on a lower surface of the re-distributed structure 109. The connection terminals 300 may be (and/or include), for example, solder balls, pillars, and/or bumps, but are not limited thereto.

The protection member 200 is formed on the surface 101 of the semiconductor device 10 and covers side surfaces of the plurality of connection terminals 300 and does not cover lower surfaces of the plurality of connection terminals 300.

For example, the protection member 200 formed on the surface 101 of the semiconductor device 10 has a first height H1 as measured from the surface 101 of the semiconductor device. The connection terminal 300 has a second height H2 from the surface 101 of the semiconductor device 10, and the second height H2 may be greater than the first height H1. Accordingly, the lower surfaces of the connection terminals 300 are exposed by the protection member 200.

The mold member 600 covers a portion (e.g., an upper portion 103b) of the side surface 103 of the semiconductor device 10 and at least a portion (e.g., a side surface) of the protection member 200 but does not cover the exposed lower surfaces of the connection terminals 300.

The protection member 200 may be formed not only on one surface 101 of the semiconductor device 10 but also to extend to cover at least a portion (e.g., a lower portion 103a) of the side surface 103. Accordingly, a portion (see 103a) of the side surfaces 103a and 103b of the semiconductor device 10 is in contact with the protection member 200, and another portion (see 103b) of the side surfaces 103a and 103b of the semiconductor device 10 is in contact with the mold member 600. Accordingly, the protection member 200 may cover and protect five surfaces (e.g., the four side surfaces and the lower surface) of the semiconductor device 10.

In some example embodiments, a third height H3 of the protection member 200 formed on the side surface 103a of the semiconductor device 10 may be smaller than the first height H1 of the protection member 200 formed on one surface 101 of the semiconductor device 10. The third height H3 may coincide with height of the protection member 200 formed on the side surface 103a of the semiconductor device 10 as measured from the surface 101 of the semiconductor device 10. In some embodiments, the third height H3 may be in a range of 5% to 20% of a thickness D of the semiconductor device 10. For example, in some embodiments, about 10% of the side surface 103 of the semiconductor device 10 may be in contact with the protection member 200, and about 90% of the side surface 103 of the semiconductor device 10 may be in contact with the mold member 600.

The protection member 200 and the mold member 600 may be made of different materials. For example, the protection member 200 may be made of a material having a relatively high coefficient of thermal expansion (CTE) and a relatively low mechanical modulus; and the mold member 600 may be made of a material having a relatively low coefficient of thermal expansion and a relatively high mechanical modulus. For example, the mechanical modulus of the mold member 600 representing, e.g., the modulus of elasticity (also referred to as a "Young's modulus") may indicate that the material(s) included in the mold member 600 may be stronger than that of the material(s) included in the protection member 200, and the coefficient of thermal expansion of the protection member 200 may be higher than the coefficient of thermal expansion of the mold member 600. In some example embodiments, for example, the protection member 200 may include a polymer film and/or a non-conductive film (NCF), and the mold member 600 may include an epoxy mold compound (EMC).

The material(s) of the protection member 200, the connection terminal 300, and/or the mold member 600 may be selected such that a difference between the coefficient of thermal expansion of the protection member 200 and a coefficient of thermal expansion of the connection terminal 300 is smaller than a difference between the coefficient of thermal expansion of the mold member 600 and the coefficient of thermal expansion of the connection terminal 300. For example, in some example embodiments, the coefficient of thermal expansion of the protection member 200 and the coefficient of thermal expansion of the connection terminal 300 may be similar to each other. For example, the coefficient of thermal expansion of the protection member 200 and the coefficient of thermal expansion of the connection terminal 300 may be within a material tolerance (e.g., 10%) of each other.

For example, the coefficient of thermal expansion of the connection terminal (e.g., a lead-free solder ball) may be 22 ppm/° C., the coefficient of thermal expansion of the protection member (e.g., the NCF) may be 20 to 25 ppm/° C., and the coefficient of thermal expansion of the mold member (e.g., the EMC) may be 10 to 15 ppm/° C. In this case, the coefficient of thermal expansion of the connection terminal 300 and the coefficient of thermal expansion of the protection member 200 may be considered similar to each other, and thus, the connection terminal 300 and the protection member 200 expand and contract together at the time of thermal deformation. In contrast, when the connection terminal 300 and the mold member 600 are in direct contact with each other and the coefficient of thermal expansion of the connection terminal 300 and the coefficient of thermal expansion of the mold member 600 are different from each other, a crack may occur along a boundary of the connection terminal 300 at the time of thermal deformation. Accordingly, the protection member 200 may serve as a stress buffer.

In addition, as will be described later with reference to FIG. 12, the protection member 200 surrounds the connection terminal 300, and may thus prevent (and/or mitigate the potential for) the connection terminal 300 from being contaminated by the mold member 600 in a molding process. Furthermore, the protection member 200 may optionally have a flux component (e.g., an organic acid), and in the molding process, the flux component may be activated to remove an oxide film on the connection terminal 300 and form a thin coating film on the connection terminal 300.

In addition, the protection member 200 may increase board level reliability (BLR). Furthermore, there is a heat dissipating effect on a connection terminal 300 side by using the protection member 200.

The mold member 600 having the relatively high mechanical modulus covers the semiconductor device 10 and the protection member 200 covers side surfaces of the semiconductor device 10 and the protection member 200. Accordingly, in a test process, the semiconductor device 10 is less subjected to external impact. In addition, the mold member 600 may increase a mechanical modulus of the semiconductor package and, thus, may thus prevent (and/or mitigate the potential for) warpage of the semiconductor package.

As illustrated in FIGS. 1 and 2, the mold member 600 may expose a surface 102 (e.g., an upper surface) of the semiconductor device 10. Accordingly, heat generated in the semiconductor device 10 may be dissipated to the outside through the exposed surface 102 of the semiconductor device 10. Although not illustrated separately in FIGS. 1 and 2, a heat spreader may be installed on the exposed surface of the semiconductor device 10 to more efficiently dissipate the heat generated in the semiconductor device 10.

Figure 3:
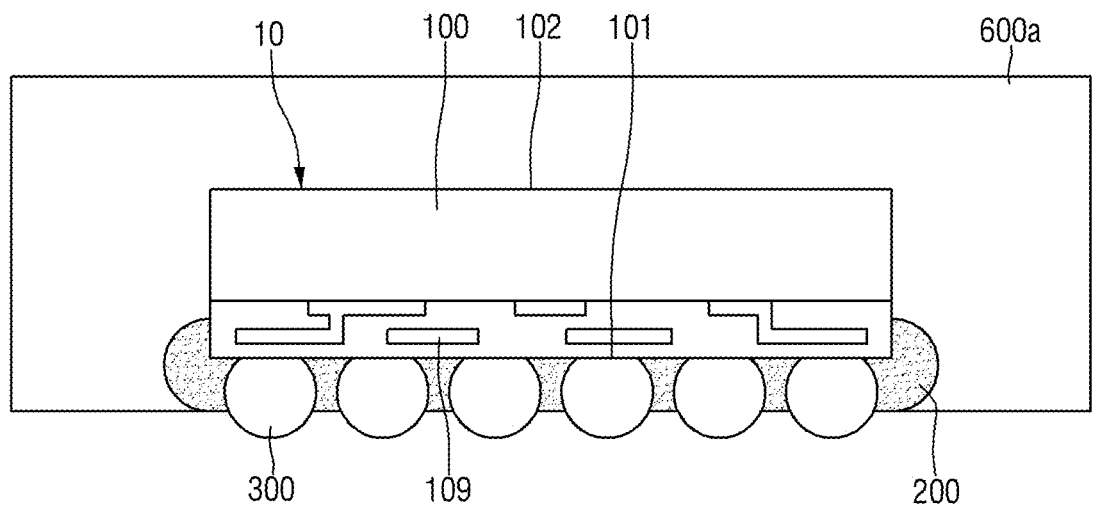
FIG. 3 is a cross-sectional view for describing a semiconductor package according to some example embodiments.

FIG. 3 is a cross-sectional view for describing a semiconductor package according to some example embodiments. For convenience of explanation, contents different from those described with reference to FIGS. 1 and 2 will be mainly described.

Referring to FIG. 3, a mold member 600*a* does not expose the surface 102 opposite to the plurality of connection terminals 300 (e.g., the upper surface) of the semiconductor device 10, and may cover the surface 102 of the semiconductor device 10. Since the mold member 600*a* covers the semiconductor device 10, it may be more difficult for heat generated in the semiconductor device 10 to be dissipated, e.g., through the surface 102 of the semiconductor device 10, but the semiconductor device 10 may be more effectively protected from external impact.

Figure 4:
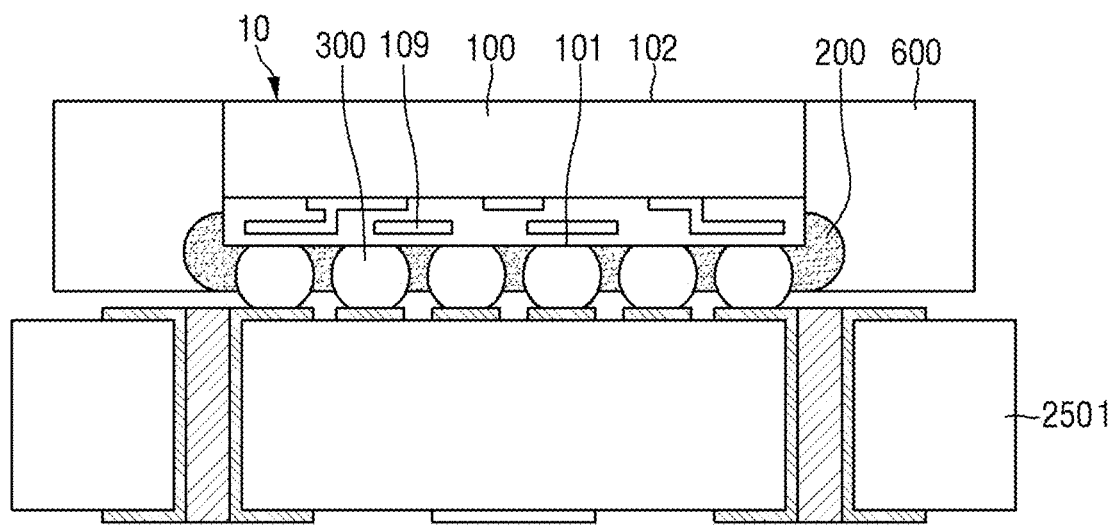
FIG. 4 is a cross-sectional view schematically illustrating a case where the semiconductor package according to some example embodiments is mounted on a main board of an electronic device.

FIG. 4 is a cross-sectional view schematically illustrating a case where the semiconductor package according to some example embodiments is mounted on a main board of an electronic device.

Referring to FIG. 4, a semiconductor package according to some example embodiments may be directly mounted on a main board 2501 of an electronic device. The example of FIG. 4 is illustrated as including the example of FIG. 1. However, the embodiments are not limited thereto, and may, for example, the electronic device may include any of the example embodiments of the semiconductor package described herein. A plurality of pads may be disposed on an upper surface of the main board 2501 and may be connected to the corresponding connection terminals 300 of the semiconductor package. The protection member 200 may be spaced apart from the main board 2501 and may be above the main board 2501.

Although not illustrated separately in FIG. 4, the semiconductor package may be directly mounted on an interposer substrate, and the interposer substrate may be connected to the main board 2501 through connection terminals (e.g., solder balls and/or the like).

Figure 5:
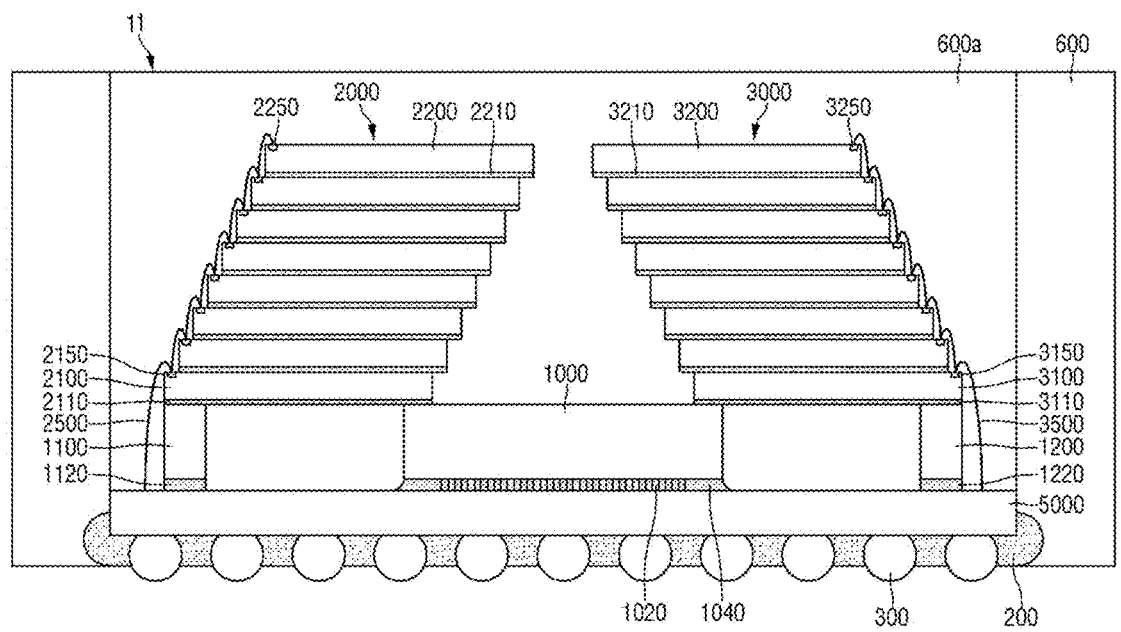
FIG. 5 is a cross-sectional view for describing a semiconductor package according to some example embodiments.

FIG. 5 is a cross-sectional view for describing a semiconductor package according to some example embodiments. For convenience of explanation, contents different from those described with reference to FIGS. 1 and 2 will be mainly described.

Referring to FIG. 5, a configuration of a semiconductor device 11 in the semiconductor package may be different from that of the semiconductor device 10 of FIG. 1.

For example, the semiconductor device 11 may include a stack of semiconductor chips. The semiconductor device 11 may include, for example, a semiconductor chip 1000, a first spacer 1100, a second spacer 1200, a first chip stack 2000, a second chip stack 3000, a substrate 5000, and/or the like.

The plurality of connection terminals 300 may disposed on one surface (e.g., a lower surface) of the semiconductor device 11. For example, the plurality of connection terminals 300 may be connected to pads on a lower surface of the substrate 5000.

The semiconductor chip 1000, the first spacer 1100, and the second spacer 1200 may be disposed on the substrate 5000 so as to be spaced apart from each other. For example, the semiconductor chip 1000 may be disposed near the center of the substrate 5000, and the first spacer 1100 and the second spacer 1200 may be disposed on both sides of the semiconductor chip 1000, respectively. The first spacer 1100 and the second spacer 1200 may be fixed to the substrate 5000 by adhesive members 1120 and 1220, respectively.

The semiconductor chip 1000 may be disposed in the form of a flip chip. The semiconductor chip 1000 may be a controller for controlling chips 2100 and 2200 of the first chip stack 2000 and the chips 3100 and 3200 of the second chip stack 3000.

The first spacer 1100 and the second spacer 1200 may be dummy chips but are not limited thereto.

The first chip stack 2000 may disposed on the semiconductor chip 1000 and the first spacer 1100, and the second chip stack 3000 may be disposed on the semiconductor chip 1000 and the second spacer 1200. For example, the first chip stack 2000, the semiconductor chip 1000, and the first spacer 1100, as a whole, may be considered to have a dolmen structure. The second chip stack 3000, the semiconductor chip 1000, and the second spacer 1200, as a whole may also be considered to have a dolmen structure. A dolmen structure may, for example, include a horizontal element and/or a plurality of horizontal elements (e.g., the first and/or second chip stacks 2000 and/or 3000) supported by a plurality of vertical elements (e.g., the semiconductor chip 1000 and the first or second spacer 1100 or 1200).

In the first chip stack 2000, a plurality of chips 2100 and 2200 may be stacked in the form of stairs going up to the right (and/or the form of stairs going down to the left or the form of stairs toward a center region of the semiconductor chip 1000). In the second chip stack 3000, a plurality of chips 3100 and 3200 may be stacked in the form of stairs going up to the left (or the form of stairs going down to the right or the form of stairs toward a center region of the semiconductor chip 1000). For example, the plurality of chips 2100 and 2200 may include a first chip 2100 and a plurality of second chips 2200 and/or may include alternating first and second chips 2100 and 2200. In some example embodiments the first chip 2100 and the second chip 2200 may be the same and/or a different type of chips. Similarly, the plurality of chips 3100 and 3200 may include a first chip 3100 and a plurality of second chips 3200 and/or may include alternating first and second chips 3100 and 3200; and the first chip 3100 and the second chip 3200 may be the same and/or different types of chips.

The respective chips 2100, 2200, 3100, and 3200 may be memory chips, logic chips, or combinations thereof. The respective chips 2100, 2200, 3100, and 3200 may be fixed to each other by adhesive members 2210 and 3210. Pads 2150, 2250, and the like, may be connected to each other by a wire 2500, and pads 3150, 3250, and the like, may be connected to each other by a wire 3500.

As described above, a protection member 200 is formed on one surface of a semiconductor device (e.g., the substrate 5000), and extends to a portion of a side surface of the semiconductor device (e.g., the substrate 5000). In addition, the protection member 200 covers side surfaces of the plurality of connection terminals 300 and does not cover lower surfaces of the plurality of connection terminals 300. The mold member 600a covers a side surface of the semiconductor device (e.g., the substrate 5000) and a portion of the protection member 200 but does not cover the lower surfaces of the connection terminals 300.

Though the example is illustrated as including the mold member 600a, which covers the upper surfaces of the first and second chip stacks 2000 and 3000, the example embodiments are not limited thereto. For example, some example embodiments may include the first and second chip stacks 2000 and 3000 and the mold member 600 (of FIG. 1) such that the upper surfaces of the first and second chip stacks 2000 and 3000 are exposed.

Figure 6:
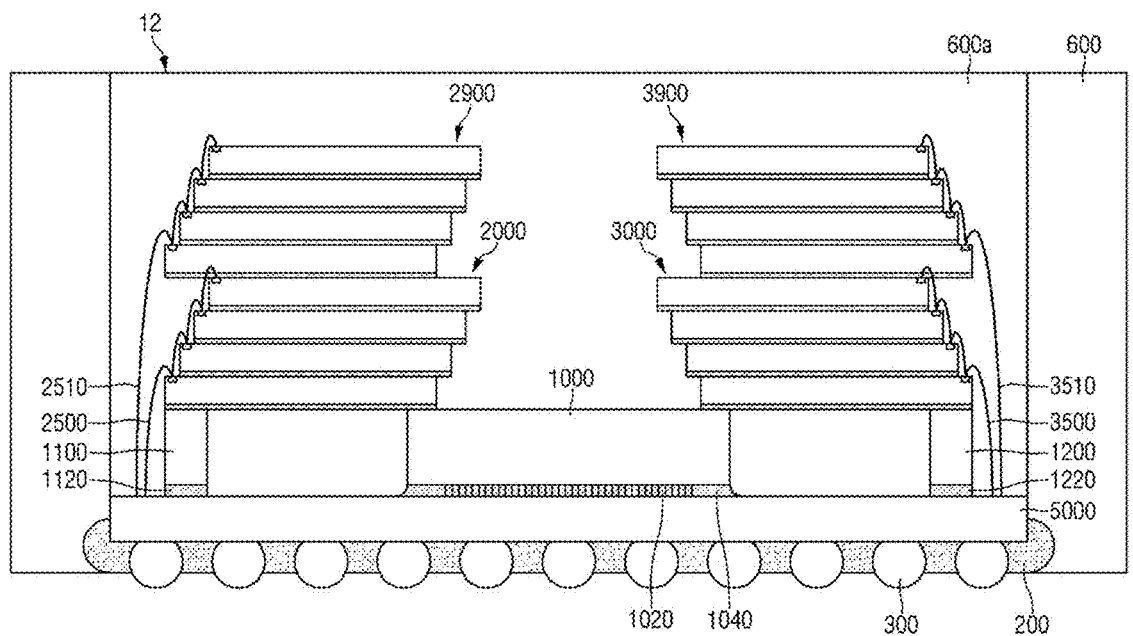
FIG. 6 is a cross-sectional view for describing a semiconductor package according to some example embodiments.

FIG. 6 is a cross-sectional view for describing a semiconductor package according to some example embodiments. For convenience of explanation, contents different from those described with reference to FIGS. 1 to 3 and 5 will be mainly described.

Referring to FIG. 6, a semiconductor device 12 includes a third chip stack 2900 formed on the first chip stack 2000 and a fourth chip stack 3900 formed on the second chip stack 3000.

The first chip stack 2000 includes chips stacked in the form of stairs going up to the right so that pads are exposed, and the third chip stack 2900 also includes chips stacked on the first chip stack 2000 in the form of stairs going up to the right so that pads are exposed.

The second chip stack 3000 includes chips stacked in the form of stairs going up to the left so that pads are exposed, and the fourth chip stack 3900 also includes chips stacked on the second chip stack 3000 in the form of stairs going up to the left so that pads are exposed.

The chips of the first chip stack 2000 are connected to the substrate 5000 through a first wire 2500. The chips of the third chip stack 2900 are connected to the substrate 5000 through a third wire 2510 different from the first wire 2500.

The chips of the second chip stack 3000 are connected to the substrate 5000 through a second wire 3500. The chips of the fourth chip stack 3900 are connected to the substrate 5000 through a fourth wire 3510 different from the second wire 3500.

Figure 7:
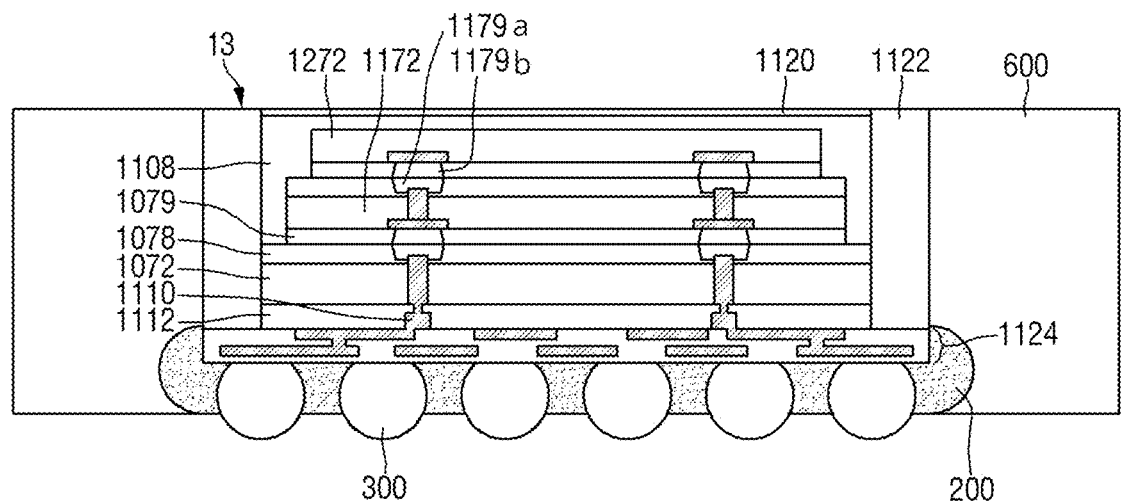
FIG. 7 is a cross-sectional view for describing a semiconductor package according to some example embodiments.

FIG. 7 is a cross-sectional view for describing a semiconductor package according to some example embodiments. For convenience of explanation, contents different from those described in the above-described example embodiments will be mainly described.

Referring to FIG. 7, a semiconductor device 13 has a structure in which three or more substrates 1072, 1172, and 1272 are stacked on a re-distributed structure 1124.

An insulating layer 1112 may be disposed on one surface of the re-distributed structure 1124 and may be formed of an insulator, such as a silicon-containing insulator (e.g., at least one of silicon nitride, silicon oxide, and/or silicon oxynitride). The insulating layer 1112 may be formed by an appropriate deposition method such as spin coating, chemical vapor deposition (CVD), plasma enhanced chemical vapor deposition (PECVD), high density plasma chemical vapor deposition (HDP-CVD), and/or the like. Conductive pillar parts 1110 are formed in the insulating layer 1112. The conductive pillar parts 1110 are electrically connected to the re-distributed structure 1124.

Vias (or through silicon vias (TSVs)) may be installed in the substrate 1072. An insulating film 1078 is formed on one surface of the substrate 1072. Another insulating film 1079 is formed on a lower surface of the substrate 1172.

Meanwhile, pads 1179a of the substrate 1172 and pads 1179b of the other substrate 1272 may be bonded to each other. Similarly, pads of the substrate 1072 and pads of the other substrate 1172 may be bonded to each other. That is, the substrates 1072, 1172, and 1272 may be bonded to each other in a die-to-die (D2D) manner.

Although not illustrated separately in FIG. 7, a concept of the present disclosure may also be applied to a die-to-wafer (D2 W) bonding and/or wafer-to-wafer (W2 W) bonding structure.

A sealant 1108 may be formed to surround the substrates 1172 and 1272. Another sealant 1122 may be formed to surround the substrates 1072, 1172, and 1272.

A structure in which the three substrates 1072, 1172, and 1272 are stacked and bonded to each other on the re-distributed structure 1124 has been illustrated in FIG. 7, but the example embodiments are not limited thereto, and may include structure in which two substrates, four, and/or more substrates are stacked and bonded to each other on the re-distributed structure 1124.

As described above, the protection member 200 is formed on one surface of the semiconductor device 13 (e.g., the re-distributed structure 1124), and extends to a portion of a side surface of the semiconductor device 13. The protection member 200 covers side surfaces of the plurality of connection terminals 300 and does not cover lower surfaces of the plurality of connection terminals 300. The mold member 600 covers a side surface of the semiconductor device 13 and a portion of the protection member 200 but does not cover the lower surfaces of the connection terminals 300. Though the protection member 200 is illustrated as covering only the sidewalls of the re-distributed structure 1125 and the molding member 600 is illustrated as covering only the sidewalls of the sealant 1122, the embodiments are not limited thereto. For example, in some example embodiments, the height (see the third height H3 of FIG. 2) of the protection member 200 covering the semiconductor device 13 may be 5% to 20% of the thickness (see the thickness D of FIG. 2) of the semiconductor device 13.

Figure 8:
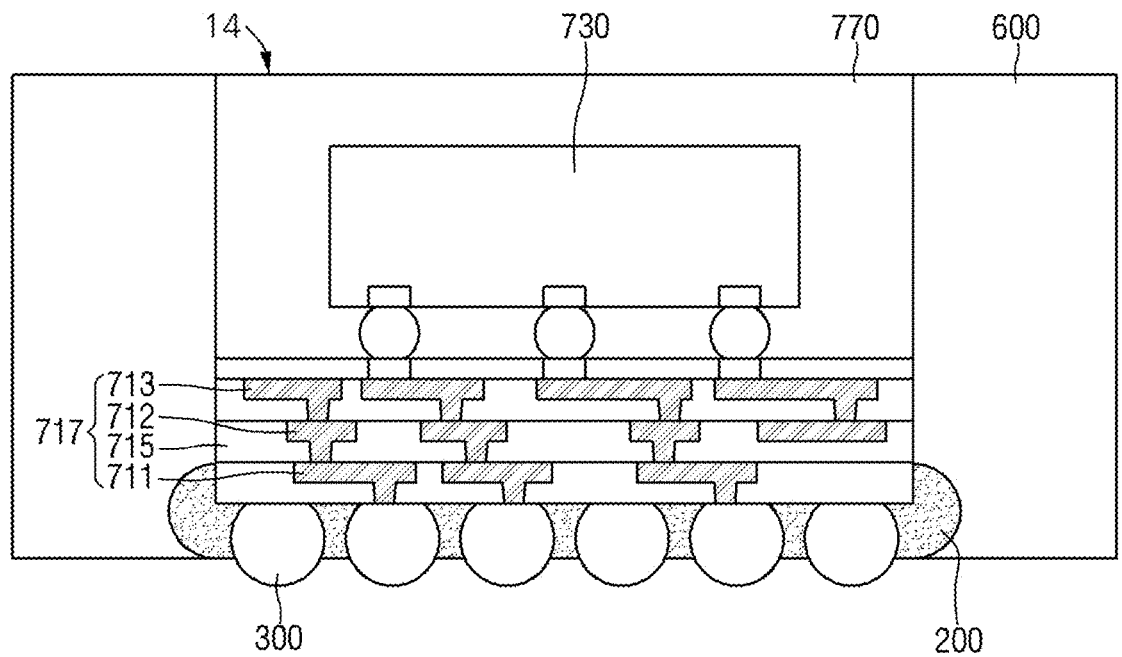
FIG. 8 is a cross-sectional view for describing a semiconductor package according to some example embodiments.

FIG. 8 is a cross-sectional view for describing a semiconductor package according to some example embodiments. For convenience of explanation, contents different from those described in the above-described example embodiments will be mainly described.

Referring to FIG. 8, a semiconductor device 14 in the semiconductor package, according to some example embodiments, may have a fan-out structure. For example, in the semiconductor device 14, a re-distributed structure 717 has an area greater than that of a semiconductor chip 730. An area formed by the semiconductor chip 730 and a mold layer 770 may be the same as the area of the re-distributed structure 717.

In the re-distributed structure 717, a plurality of wiring layers 711, 712, and 713 are stacked and disposed, and an insulating layer 715 is positioned between the plurality of wiring layers 711, 712, and 713. A chip last structure (e.g., a structure in which the re-distributed structure 717 is formed and the semiconductor chip 730 is then disposed on the re-distributed structure 717) has been illustrated in FIG. 8, but the present disclosure is not limited thereto. For example, the present disclosure may also be applied to a chip first structure, (e.g., a structure in which the mold layer surrounding the semiconductor chip is formed and the re-distributed structure is then formed on the mold layer).

The plurality of connection terminals 300 are disposed on one surface (e.g., a lower surface) of the semiconductor device 14. The protection member 200 is formed on one surface (e.g., a lower surface) of the semiconductor device 14, and covers side surfaces of the plurality of connection terminals 300 and does not cover lower surfaces of the plurality of connection terminals 300.

The mold member 600 covers a portion of a side surface of the semiconductor device 14 and a portion of the protection member 200 but does not cover the lower surfaces of the connection terminals 300.

Though the protection member 200 is illustrated as covering only the sidewalls of the lowermost of the insulating layers 715 the embodiments are not limited thereto. For example, in some example embodiments, the height (see the third height H3 of FIG. 2) of the protection member 200 covering the semiconductor device 14 may be 5% to 20% of the thickness (see the thickness D of FIG. 2) of the semiconductor device 14.

Referring to FIGS. 7 and 8, though the examples are illustrated as including the mold member 600, which exposes the upper surfaces of the semiconductor devices 13 and 14, the example embodiments are not limited thereto. For example, some example embodiments may include the mold member 600a (see FIG. 3) such that the upper surfaces of the semiconductor devices 13 and 14 are covered by the mold member 600a.

Hereinafter, a method for fabricating the semiconductor package according to some example embodiments will be described with reference to FIGS. 9 to 16. FIGS. 9 to 16 are cross-sectional views illustrating intermediate steps for fabricating of a semiconductor package 100. The semiconductor package 100 may be, for example, any of the example embodiments of the semiconductor package described herein.

Figure 9:
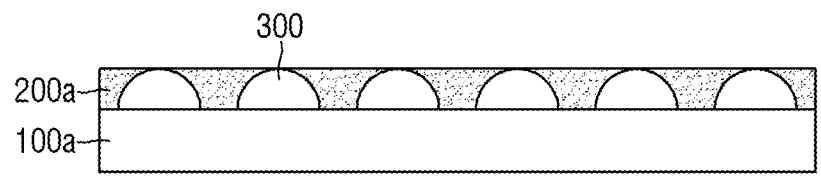
FIGS. 9 to 16 are cross-sectional views illustrating intermediate steps for fabricating the semiconductor package according to some example embodiments.

Referring to FIG. 9, a plurality of connection terminals 300 and a protective material layer 200a are formed on a wafer 100a. For example, the plurality of connection terminals 300 may be added to the wafer 100a, and the protective material layer 200a may be formed between the plurality of connection terminals 300. The protective material layer 200a may include a pre-cursor material and/or the same material as the protective member 200 (see FIG. 1). For example, the protective material layer 200a may be (and/or include) a polymer film and/or a non-conductive film (NCF). The protective material layer 200a may include a flux. In FIG. 9, upper surfaces of the connection terminals 300 and an upper surface of the protective material layer 200a may be substantially the same as each other. Alternatively, the protective material layer 200a may be formed to cover the upper surfaces of the connection terminals 300.

Figure 10:
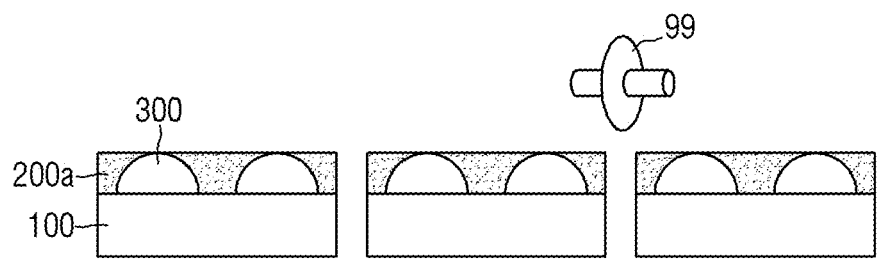

Referring to FIG. 10, the wafer 100a, the connection terminal 300, and the protective material layer 200a are divided into units (e.g., of individual chips) through, e.g., a sawing device 99. When NCF is used as the protective material layer 200a, the NCF may be transparent, and thus, a scribe line on the wafer 100a may be apparent through the protective material layer 200a. Therefore, the wafer 100a, the connection terminal 300, and the protective material layer 200a may be easily divided into units of individual chips, e.g., using the sawing device 99. In FIG. 10, for convenience of explanation, only two connection terminals 300 have been illustrated on the one surface of each of the semiconductor devices 100. The semiconductor device 100 may be, for example the semiconductor device 10 of FIG. 1, and/or any of the example embodiments of the semiconductor package described herein.

Figure 11:
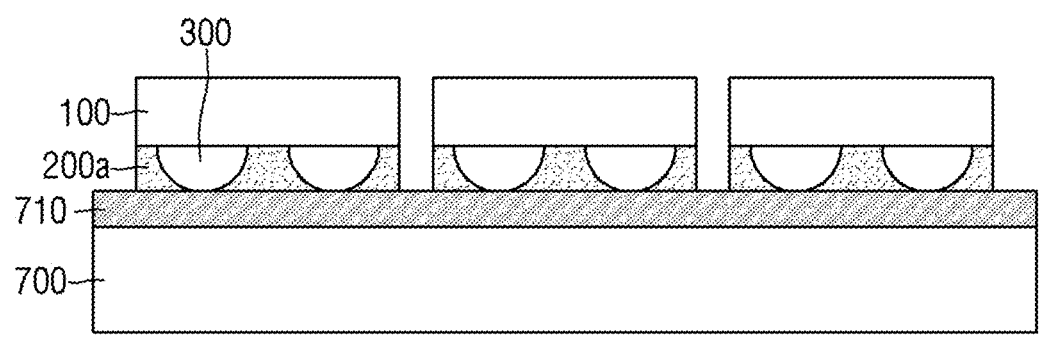

Referring to FIG. 11, an adhesive layer 710 is formed on a support substrate 700. The adhesive layer 710 may be, for example, a lamination film.

A plurality of the intermediate structures fabricated in FIG. 10 are fixed onto the support substrate 700. The connection terminals 300 and the protective material layer 200a of the intermediate structure face the support substrate 700. Accordingly, the adhesive layer 710 is positioned between the support substrate 700 and the plurality of intermediate structures. Then, the adhesive layer 710 is cured (e.g., using ultraviolet (UV)) to temporarily attach the plurality of intermediate structures onto the support substrate 700.

Figure 12:
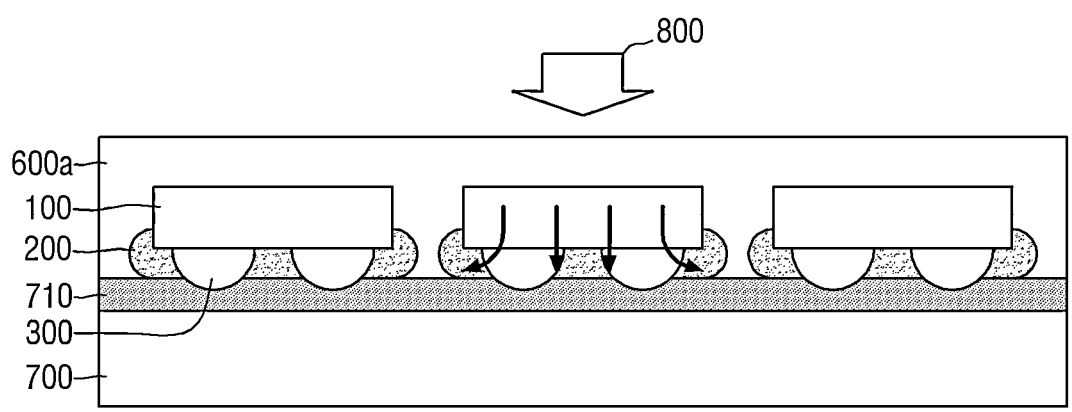

Referring to FIG. 12, a mold material layer 600a is formed on the support substrate 700 to cover the plurality of intermediate structures.

In some example embodiments, a process temperature during a period in which the mold material layer 600a is formed may be, for example, 125° C. to 175° C. Such a process temperature may be higher than a glass transition temperature (Tg) of the protective material layer 200a and/or may be lower than the melting temperature of plurality of the connection terminals 300. Accordingly, the protective material layer 200a may be changed from a solid state to a soft state.

In addition, while the mold material layer 600a is formed, a pressure may be applied (e.g., from above the mold material layer 600a) to the mold material layer 600a (see reference numeral 800).

When such a pressure is applied, the protective material layer 200a (in the soft state) spreads sideways. The protective material layer 200a covers portions of side surfaces of semiconductor devices 100 by extending to portions of the side surfaces of the semiconductor devices 10 while coming out sideways in a fillet form. In such a manner, the protection member 200 (e.g., as described with reference to FIGS. 1 and 2) is completed.

In addition, when such a pressure is applied, the plurality of connection terminals 300 protrude from the protective material layer 200a, such that lower surfaces of the plurality of connection terminals 300 come into contact with the adhesive layer 710. For example, the pressure may partially embed the plurality of connection terminals 300 into the adhesive layer 710.

In addition, the process temperature (e.g., 125° C. to 175° C.) during the period in which the mold material layer 600a is formed may be high enough that the flux of the protective material layer 200a may be activated and diffused at the process temperature. Thus, in the example embodiments wherein the protective material layer 200a includes flux, the diffused flux may remove oxide films of the connection terminals 300 and form thin coating films. Accordingly, re-oxidation of the connection terminals 300 is prevented.

In addition, since the protection member 200 is formed on side surfaces of the connection terminals 300, the connection terminals 300 are not contaminated by the mold material layer 600a. If the connection terminals 300 are contaminated by the mold material layer 600a, a contact failure may occur between the connection terminals 300 and pads of a main board when the semiconductor package is mounted on the main board.

Figure 13:
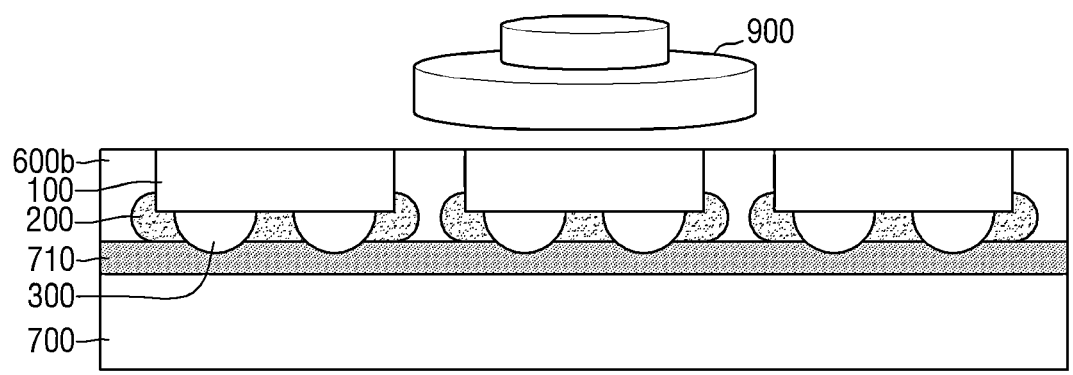

Referring to FIG. 13, the mold material layer 600b is formed using, e.g., a grinder 900 to remove a portion (e.g., an upper portion) of the mold material layer 600a and/or to expose the other surfaces (e.g., upper surfaces) of the semiconductor devices 100.

Figure 14:
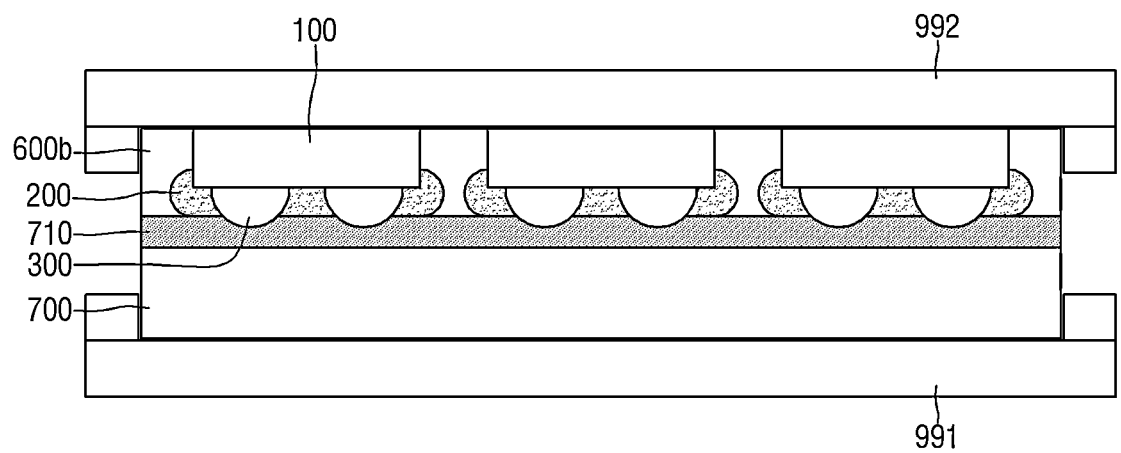
Figure 15:
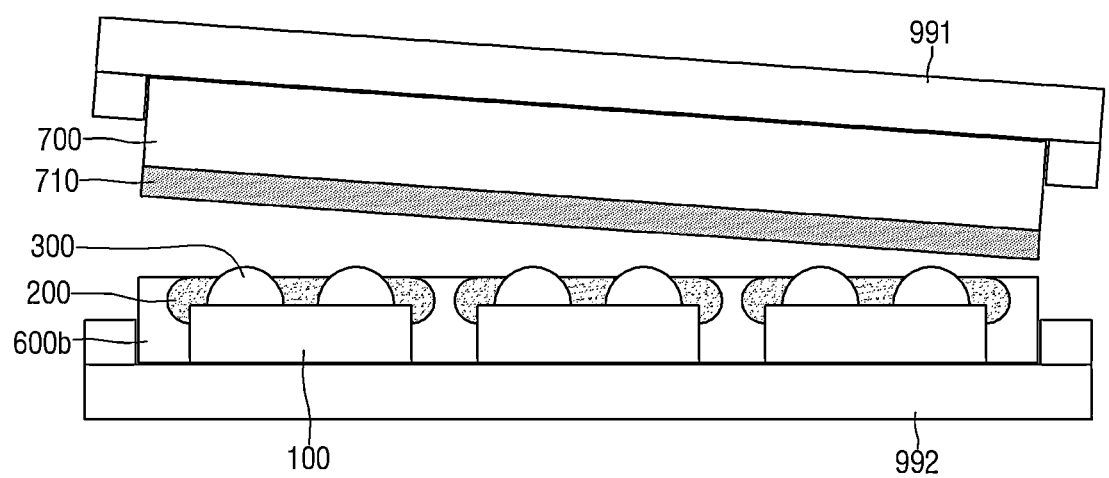

Referring to FIGS. 14 and 15, the semiconductor devices 100 and the support substrate 700 then debonded from each other, using debonding devices 991 and 992.

Figure 16:
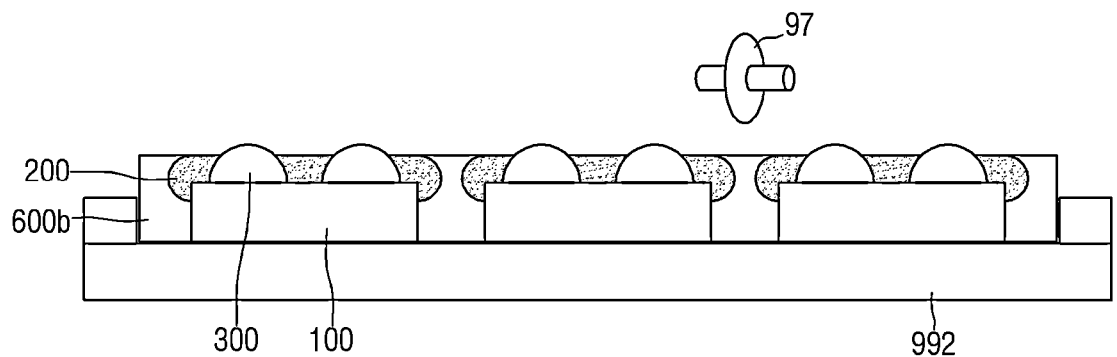

Referring to FIG. 16, a cleaning process is performed on the connection terminals 300 exposed after the semiconductor devices 100 and the support substrate 700 are debonded from each other to prevent secondary contamination of the connection terminals 300.

Then, the mold material layer 600b and the like are divided in units of individual packages through a sawing device 97 to complete the semiconductor package according to some example embodiments.

Figure 17:
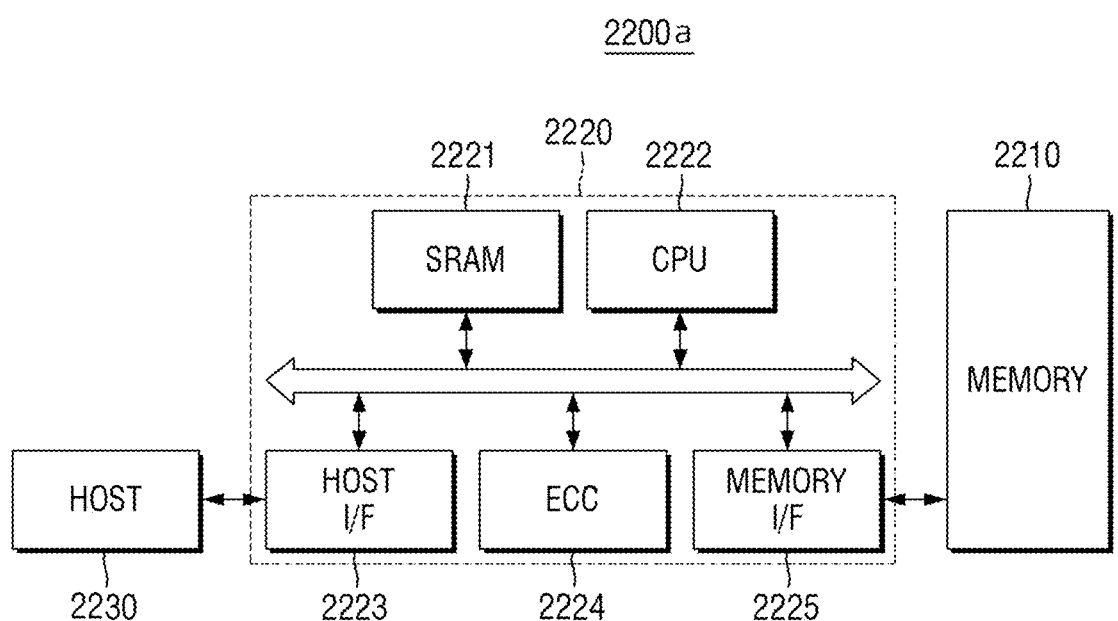
FIG. 17 is a block diagram illustrating a memory card including semiconductor packages according to some example embodiments.

FIG. 17 is a block diagram illustrating a memory card including semiconductor packages according to some example embodiments.

Referring to FIG. 17, semiconductor devices/packages according to some exemplary embodiments of the present disclosure may be applied to a memory card 2200a.

The memory card 2200a may include a memory controller 2220 controlling data exchange between a host 2230 and a memory 2210. A static random access memory (SRAM) 2221 may be used as an operation memory of a central processing unit (CPU) 2222. A host interface 2223 may include a data exchange protocol of the host 2230 connected to the memory card 2200a. An error correction code (ECC) 2224 may detect and correct an error included in data read from the memory 2210. A memory interface 2225 may interface with the memory 2210. The central processing unit 2222 may perform various control operations for data exchange of the memory controller 2220.

For example, at least one of the memory 2210 and/or the central processing unit 2222 may include at least one of the example embodiments of the semiconductor devices and/or packages described herein.

Figure 18:
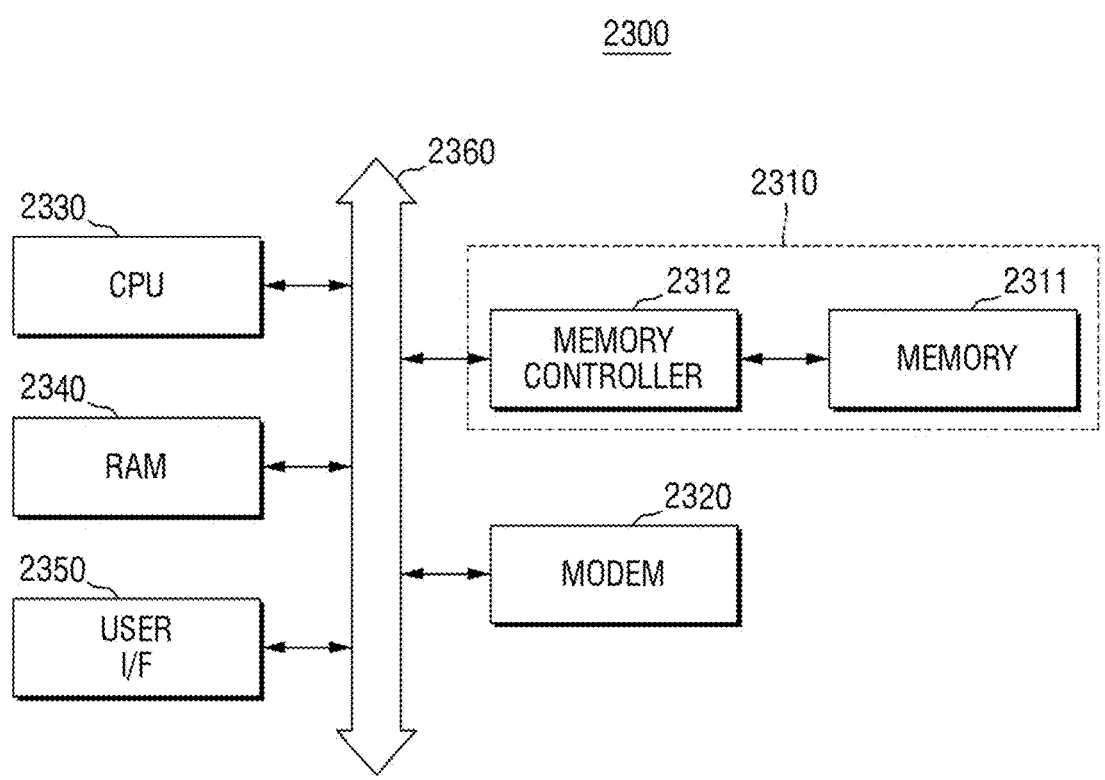
FIG. 18 is a block diagram illustrating an information processing system to which semiconductor packages according to some example embodiments are applied.

FIG. 18 is a block diagram illustrating an information processing system to which semiconductor packages according to some example embodiments.

Referring to FIG. 18, a semiconductor devices and/or packages according to any of the example embodiments described herein may be applied to an information processing system 2300.

The information processing system 2300 may include (and/or be included in) a mobile device, a computer, and/or the like. The information processing system 2300 may include a memory system 2310, a modem 2320, a central processing unit (CPU) 2330, a random access memory (RAM) 2340, a user interface 2350, and/or the like, that are electrically connected to a system bus 2360. The memory system 2310 includes a memory 2311 and a memory controller 2312 and may be configured to be substantially the same as the memory card 2200 of FIG. 19. In addition, at least one of the central processing unit 2330 and/or the RAM 2340 may include a semiconductor devices and/or packages according to any of the example embodiments described herein.

Data processed by the central processing unit 2330 or data input from the outside may be stored in such a memory system 2310. The information processing system 2300 may be provided as a memory card, a solid state disk (SSD), a camera image sensor, and/or other application chipsets. As an example, the memory system 2310 may be configured as the semiconductor disk device (SSD). In this case, the information processing system 2300 may stably and reliably store a large amount of data in the memory system 2310.

In this disclosure, the various functional blocks denoting elements that process (and/or perform) at least one function or operation and may be included in and/or implemented as processing circuitry such hardware, software, or the combination of hardware and software. For example, the processing circuitry more specifically may include (and/or be included in), but is not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Example embodiments of the present disclosure have been described hereinabove with reference to the accompanying drawings, but the present disclosure is not limited to the above-described example embodiments, and may be implemented in various different forms, and one of ordinary skill in the art to which the present disclosure pertains may understand that the present disclosure may be implemented in other specific forms without changing the technical spirit or essential features of the present disclosure. Therefore, it is to be understood that the example embodiments described above are illustrative rather than being restrictive in all aspects.

What is claimed is:

1. A semiconductor package comprising:
   a semiconductor device;
   a plurality of connection terminals on a first surface of the semiconductor device;
   a protection member on the first surface of the semiconductor device and partially covering side surfaces of the plurality of connection terminals such that the protection member exposes lower surfaces of the plurality of connection terminals; and
   a mold member that covers a side surface of the semiconductor device and a portion of the protection member such that the mold member does not cover the lower surfaces of the plurality of connection terminals,
   wherein a side surface of the protection member, in a cross-sectional view, is curved such that the protection member has a width greater than a width of a lower surface of the protection member.

2. The semiconductor package of claim 1, wherein at least a first portion of the protection member has a height of 5% to 20% of a thickness of the semiconductor device.

3. The semiconductor package of claim 1, wherein a second surface of the semiconductor device, opposite to the first surface, is exposed by the mold member.

4. The semiconductor package of claim 1, wherein
the protection member on the first surface of the semiconductor device has a first height as measured in a vertical direction perpendicular to the first surface of the semiconductor device,
the plurality of connection terminals has a second height as measured in the vertical direction perpendicular to the first surface of the semiconductor device, and
the second height is greater than the first height.

5. The semiconductor package of claim 1, wherein a mechanical modulus of the mold member is higher than a mechanical modulus of the protection member.

6. The semiconductor package of claim 1, wherein a difference between a coefficient of thermal expansion of the protection member and a coefficient of thermal expansion of the plurality of connection terminals is smaller than a difference between a coefficient of thermal expansion of the mold member and the coefficient of thermal expansion of the plurality of connection terminals.

7. The semiconductor package of claim 1, wherein the protection member extends to the side surface of the semiconductor device such that a first portion of the side surface of the semiconductor device is in contact with the protection member, and a second portion of the side surface of the semiconductor device is in contact with the mold member.

8. A semiconductor package comprising:
a semiconductor device;
a plurality of connection terminals on a first surface of the semiconductor device;
a protection member on the first surface of the semiconductor device and partially covering side surfaces of the plurality of connection terminals such that the protection member exposes lower surfaces of the plurality of connection terminals; and
a mold member that covers a side surface of the semiconductor device and a portion of the protection member such that the mold member exposes a second surface of the semiconductor device and does not cover the lower surfaces of the plurality of connection terminals, the second surface opposite to the first surface,
wherein the protection member extends to the side surface of the semiconductor device such that a first portion of the side surface of the semiconductor device is in contact with the protection member, and a second portion of the side surface of the semiconductor device is in contact with the mold member, and
a difference between a coefficient of thermal expansion of the protection member and a coefficient of thermal expansion of the plurality of connection terminals is smaller than a difference between a coefficient of thermal expansion of the mold member and the coefficient of thermal expansion of the plurality of connection terminals, and
a side surface of the protection member, in a cross-sectional view, is curved such that the protection member has a width greater than a width of a lower surface of the protection member.

9. The semiconductor package of claim 8, wherein the protection member on the first portion has a height of 5% to 20% of a thickness of the semiconductor device.

10. The semiconductor package of claim 8, wherein
the protection member on the first surface of the semiconductor device has a first height as measured in a vertical direction perpendicular to the first surface of the semiconductor device,
the plurality of connection terminals has a second height as measured in the vertical direction perpendicular to the first surface of the semiconductor device, and
the second height is greater than the first height.

11. The semiconductor package of claim 8, wherein a mechanical modulus of the mold member is higher than a mechanical modulus of the protection member.

* * * * *